US009401276B2

(12) United States Patent
Moslehi et al.

(10) Patent No.: US 9,401,276 B2
(45) Date of Patent: Jul. 26, 2016

(54) APPARATUS FOR FORMING POROUS SILICON LAYERS ON AT LEAST TWO SURFACES OF A PLURALITY OF SILICON TEMPLATES

(75) Inventors: Mehrdad M. Moslehi, Los Altos, CA (US); Karl-Josef Kramer, San Jose, CA (US); David Xuan-Qi Wang, Fremont, CA (US); Pawan Kapur, Palo Alto, CA (US); Somnath Nag, Saratoga, CA (US); George D. Kamian, Scotts Valley, CA (US); Jay Ashjaee, Milpitas, CA (US); Takao Yonehara, Milpitas, CA (US)

(73) Assignee: Solexel, Inc., Milpitas, CA (US)

( * ) Notice: Subject to any disclaimer, the term of this patent is extended or adjusted under 35 U.S.C. 154(b) by 418 days.

(21) Appl. No.: 13/554,103

(22) Filed: Jul. 20, 2012

(65) Prior Publication Data

US 2013/0171808 A1    Jul. 4, 2013

Related U.S. Application Data

(63) Continuation of application No. 13/026,239, filed on Feb. 12, 2011, now Pat. No. 8,241,940.

(60) Provisional application No. 61/304,340, filed on Feb. 12, 2010.

(51) Int. Cl.
*H01L 21/20* (2006.01)
*H01L 31/18* (2006.01)

(52) U.S. Cl.
CPC ............ *H01L 21/20* (2013.01); *H01L 31/1804* (2013.01); *Y02E 10/547* (2013.01); *Y02P 70/521* (2015.11)

(58) Field of Classification Search
None
See application file for complete search history.

(56) References Cited

U.S. PATENT DOCUMENTS

| | | | |
|---|---|---|---|
| 4,043,894 A | 8/1977 | Gibbs | |
| 4,070,206 A | 1/1978 | Kressel et al. | |
| 4,082,570 A | 4/1978 | House et al. | |
| 4,165,252 A | 8/1979 | Gibbs | |
| 4,249,959 A | 2/1981 | Jebens | |
| 4,251,679 A | 2/1981 | Zwan | |

(Continued)

FOREIGN PATENT DOCUMENTS

| | | |
|---|---|---|
| CN | 1188820 A | 7/1998 |
| CN | 1841676 A | 10/2006 |

(Continued)

OTHER PUBLICATIONS

Alvin D. Compaan, Photovoltaics: Clean Power for the 21st Century, Solar Energy Materials & Solar Cells, 2006, pp. 2170-2180, vol. 90, Elsevier B.V.

(Continued)

*Primary Examiner* — Yasser A Abdelaziez
(74) *Attorney, Agent, or Firm* — John Wood

(57) ABSTRACT

An apparatus for forming porous silicon layers on at least two surfaces of a plurality of silicon templates in a batch electrochemical anodic etch process is provided. The apparatus comprises a plurality of edge-sealing template mounts operable to prevent formation of porous silicon at the edges of a plurality of templates. An electrolyte is disposed among the plurality of templates. The apparatus further comprises a power supply operable to switch polarity, change current intensity, and control etching time to produce the porous silicon layers.

4 Claims, 10 Drawing Sheets

(56) References Cited

U.S. PATENT DOCUMENTS

| | | |
|---|---|---|
| 4,348,254 A | 9/1982 | Lindmayer |
| 4,361,950 A | 12/1982 | Amick |
| 4,409,423 A | 10/1983 | Holt |
| 4,427,839 A | 1/1984 | Hall |
| 4,430,519 A | 2/1984 | Young |
| 4,461,922 A | 7/1984 | Gay et al. |
| 4,479,847 A | 10/1984 | McCaldin et al. |
| 4,626,613 A | 12/1986 | Wenham et al. |
| 4,661,212 A | 4/1987 | Ehrfeld et al. |
| 4,672,023 A | 6/1987 | Leung |
| 4,922,277 A | 5/1990 | Carlson |
| 5,024,953 A | 6/1991 | Uematsu et al. |
| 5,073,230 A | 12/1991 | Maracas et al. |
| 5,112,453 A | 5/1992 | Behr et al. |
| 5,208,068 A | 5/1993 | Davis |
| 5,248,621 A | 9/1993 | Sano |
| 5,316,593 A | 5/1994 | Olson et al. |
| 5,348,618 A | 9/1994 | Canham et al. |
| 5,358,600 A | 10/1994 | Canham et al. |
| 5,397,400 A | 3/1995 | Matsuno et al. |
| 5,458,755 A | 10/1995 | Fujiyama et al. |
| 5,459,099 A | 10/1995 | Hsu |
| 5,494,832 A | 2/1996 | Lehmann et al. |
| 5,538,564 A | 7/1996 | Kaschmitter |
| 5,616,185 A | 4/1997 | Kukulka |
| 5,645,684 A | 7/1997 | Keller |
| 5,653,803 A * | 8/1997 | Ito ................................ 438/404 |
| 5,660,680 A | 8/1997 | Keller |
| 5,679,233 A | 10/1997 | Van Anglen et al. |
| 5,681,392 A | 10/1997 | Swain |
| 5,689,603 A | 11/1997 | Huth |
| 5,704,992 A | 1/1998 | Willeke et al. |
| 5,882,988 A | 3/1999 | Haberern et al. |
| 5,899,360 A | 5/1999 | Mack et al. |
| 5,928,438 A | 7/1999 | Salami |
| 5,951,833 A | 9/1999 | Yamagata |
| 5,994,640 A | 11/1999 | Bansemir et al. |
| 6,058,945 A | 5/2000 | Fujiyama et al. |
| 6,091,021 A | 7/2000 | Ruby |
| 6,096,229 A | 8/2000 | Shahid |
| 6,114,046 A | 9/2000 | Hanoka |
| 6,127,623 A | 10/2000 | Nakamura et al. |
| 6,143,629 A | 11/2000 | Sato |
| 6,197,654 B1 | 3/2001 | Swanson |
| 6,204,443 B1 | 3/2001 | Kiso et al. |
| 6,225,193 B1 | 5/2001 | Simpson et al. |
| 6,235,147 B1 | 5/2001 | Lee et al. |
| 6,254,759 B1 | 7/2001 | Rasmussen |
| 6,258,244 B1 | 7/2001 | Ohmi et al. |
| 6,294,725 B1 | 9/2001 | Hirschberg et al. |
| 6,313,397 B1 | 11/2001 | Washio et al. |
| 6,331,208 B1 | 12/2001 | Nishida et al. |
| 6,399,143 B1 | 6/2002 | Sun |
| 6,416,647 B1 | 7/2002 | Dordi et al. |
| 6,417,069 B1 | 7/2002 | Sakaguchi et al. |
| 6,428,620 B1 | 8/2002 | Yamagata |
| 6,429,037 B1 | 8/2002 | Wenham et al. |
| 6,441,297 B1 | 8/2002 | Keller et al. |
| 6,448,155 B1 | 9/2002 | Iwasaki et al. |
| 6,461,932 B1 | 10/2002 | Wang |
| 6,517,697 B1 | 2/2003 | Yamagata |
| 6,524,880 B2 | 2/2003 | Moon et al. |
| 6,534,336 B1 | 3/2003 | Iwane et al. |
| 6,551,908 B2 | 4/2003 | Ukiyo et al. |
| 6,555,443 B1 | 4/2003 | Artmann et al. |
| 6,566,235 B2 | 5/2003 | Nishida et al. |
| 6,602,760 B2 | 8/2003 | Poortmans et al. |
| 6,602,767 B2 | 8/2003 | Nishida et al. |
| 6,613,148 B1 | 9/2003 | Rasmussen |
| 6,624,009 B1 | 9/2003 | Green et al. |
| 6,645,833 B2 | 11/2003 | Brendel |
| 6,649,485 B2 | 11/2003 | Solanki et al. |
| 6,653,722 B2 | 11/2003 | Blalock |
| 6,664,169 B1 | 12/2003 | Iwasaki et al. |
| 6,726,815 B1 | 4/2004 | Artman et al. |
| 6,756,289 B1 | 6/2004 | Nakagawa et al. |
| 6,805,966 B1 | 10/2004 | Formato et al. |
| 6,818,104 B2 | 11/2004 | Iwasaki et al. |
| 6,881,644 B2 | 4/2005 | Malik et al. |
| 6,946,052 B2 | 9/2005 | Yanagita et al. |
| 6,964,732 B2 | 11/2005 | Solanki |
| 7,014,748 B2 | 3/2006 | Matsumura et al. |
| 7,022,585 B2 | 4/2006 | Solanki et al. |
| 7,026,237 B2 | 4/2006 | Lamb |
| 7,309,658 B2 | 12/2007 | Lazovsky et al. |
| 7,368,756 B2 | 5/2008 | Bruhns et al. |
| 7,402,523 B2 | 7/2008 | Nishimura |
| 7,625,609 B2 | 12/2009 | Matsuura |
| 7,745,313 B2 | 6/2010 | Wang et al. |
| 7,786,376 B2 | 8/2010 | Nag et al. |
| 7,999,174 B2 | 8/2011 | Moslehi et al. |
| 8,035,027 B2 | 10/2011 | Moslehi et al. |
| 8,035,028 B2 | 10/2011 | Moslehi et al. |
| 8,053,665 B2 | 11/2011 | Moslehi et al. |
| 8,084,684 B2 | 12/2011 | Moslehi et al. |
| 8,129,822 B2 | 3/2012 | Moslehi et al. |
| 8,168,465 B2 | 5/2012 | Wang et al. |
| 8,193,076 B2 | 6/2012 | Moslehi et al. |
| 8,241,940 B2 | 8/2012 | Moslehi et al. |
| 8,906,218 B2 | 12/2014 | Kramer et al. |
| 8,926,803 B2 | 1/2015 | Crafts et al. |
| 8,992,746 B2 | 3/2015 | Miyaji et al. |
| 8,999,058 B2 | 4/2015 | Kamian et al. |
| 9,076,642 B2 | 7/2015 | Yonehara et al. |
| 2002/0079290 A1 | 6/2002 | Holdermann |
| 2002/0106874 A1 | 8/2002 | Iwane et al. |
| 2002/0153039 A1 | 10/2002 | Moon et al. |
| 2002/0168592 A1 | 11/2002 | Vezenov |
| 2002/0179140 A1 | 12/2002 | Toyomura |
| 2003/0008473 A1 | 1/2003 | Sakaguchi et al. |
| 2003/0017712 A1 | 1/2003 | Brendel |
| 2003/0039843 A1 | 2/2003 | Johnson |
| 2003/0121773 A1 | 7/2003 | Matsumura et al. |
| 2003/0124761 A1 | 7/2003 | Baert |
| 2003/0186517 A1 * | 10/2003 | Takagi ........................ 438/478 |
| 2004/0021062 A1 | 2/2004 | Zaidi |
| 2004/0028875 A1 | 2/2004 | Van Rijn |
| 2004/0035532 A1 | 2/2004 | Jung et al. |
| 2004/0173790 A1 | 9/2004 | Yeo |
| 2004/0175893 A1 | 9/2004 | Vatus et al. |
| 2004/0192044 A1 | 9/2004 | Degertekin et al. |
| 2004/0217005 A1 | 11/2004 | Rosenfeld et al. |
| 2004/0235406 A1 | 11/2004 | Duescher |
| 2004/0256238 A1 | 12/2004 | Suzuki et al. |
| 2004/0259335 A1 | 12/2004 | Narayanan |
| 2004/0265587 A1 | 12/2004 | Koyanagi |
| 2005/0092600 A1 | 5/2005 | Yoshioka et al. |
| 2005/0160970 A1 | 7/2005 | Niira |
| 2005/0172998 A1 | 8/2005 | Gee et al. |
| 2005/0176164 A1 | 8/2005 | Gee et al. |
| 2005/0177343 A1 | 8/2005 | Nagae |
| 2005/0199279 A1 | 9/2005 | Yoshimine et al. |
| 2005/0274410 A1 | 12/2005 | Yuuki et al. |
| 2005/0281982 A1 | 12/2005 | Li |
| 2006/0021565 A1 | 2/2006 | Zahler et al. |
| 2006/0043495 A1 | 3/2006 | Uno |
| 2006/0054212 A1 | 3/2006 | Fraas et al. |
| 2006/0070884 A1 | 4/2006 | Momoi et al. |
| 2006/0105492 A1 | 5/2006 | Veres et al. |
| 2006/0105912 A1 | 5/2006 | Konle et al. |
| 2006/0177988 A1 | 8/2006 | Shea et al. |
| 2006/0196536 A1 | 9/2006 | Fujioka |
| 2006/0231031 A1 | 10/2006 | Dings et al. |
| 2006/0266916 A1 | 11/2006 | Miller et al. |
| 2006/0270179 A1 | 11/2006 | Yang |
| 2006/0283495 A1 | 12/2006 | Gibson |
| 2006/0286775 A1 | 12/2006 | Singh et al. |
| 2007/0077770 A1 | 4/2007 | Wang et al. |
| 2007/0082499 A1 | 4/2007 | Jung et al. |
| 2007/0187257 A1 | 8/2007 | Noji et al. |
| 2007/0251817 A1 | 11/2007 | Kido et al. |
| 2008/0047601 A1 | 2/2008 | Nag et al. |
| 2008/0128641 A1 | 6/2008 | Henley et al. |
| 2008/0157283 A1 | 7/2008 | Moslehi |

(56) References Cited

U.S. PATENT DOCUMENTS

| | | | |
|---|---|---|---|
| 2008/0173238 A1* | 7/2008 | Nakashima et al. | 118/723 R |
| 2008/0210294 A1 | 9/2008 | Moslehi | |
| 2008/0264477 A1 | 10/2008 | Moslehi | |
| 2008/0277885 A1 | 11/2008 | Duff et al. | |
| 2008/0289684 A1 | 11/2008 | Moslehi | |
| 2008/0295887 A1 | 12/2008 | Moslehi | |
| 2009/0042320 A1 | 2/2009 | Wang et al. | |
| 2009/0107545 A1 | 4/2009 | Moslehi | |
| 2009/0151784 A1 | 6/2009 | Luan et al. | |
| 2009/0199901 A1 | 8/2009 | Trassl et al. | |
| 2009/0260685 A1 | 10/2009 | Lee et al. | |
| 2009/0301549 A1 | 12/2009 | Moslehi | |
| 2010/0022074 A1 | 1/2010 | Wang et al. | |
| 2010/0116316 A1 | 5/2010 | Moslehi et al. | |
| 2010/0144080 A1 | 6/2010 | Ong | |
| 2010/0148318 A1 | 6/2010 | Wang et al. | |
| 2010/0148319 A1 | 6/2010 | Wang et al. | |
| 2010/0154998 A1 | 6/2010 | Ong | |
| 2010/0175752 A1 | 7/2010 | Wang et al. | |
| 2010/0203711 A1 | 8/2010 | Wang et al. | |
| 2010/0267186 A1 | 10/2010 | Wang et al. | |
| 2010/0267245 A1 | 10/2010 | Kamian et al. | |
| 2010/0279494 A1 | 11/2010 | Wang et al. | |
| 2010/0294333 A1 | 11/2010 | Wang et al. | |
| 2010/0294356 A1 | 11/2010 | Parikh et al. | |
| 2010/0300518 A1 | 12/2010 | Moslehi et al. | |
| 2010/0304521 A1 | 12/2010 | Seutter et al. | |
| 2010/0304522 A1 | 12/2010 | Rana et al. | |
| 2011/0014742 A1 | 1/2011 | Parikh et al. | |
| 2011/0030610 A1 | 2/2011 | Kamian et al. | |
| 2011/0108098 A1 | 5/2011 | Kapur et al. | |
| 2011/0120882 A1 | 5/2011 | Crafts et al. | |
| 2011/0124145 A1 | 5/2011 | Moslehi et al. | |
| 2011/0265867 A1 | 11/2011 | Moslehi et al. | |
| 2011/0272013 A1 | 11/2011 | Moslehi et al. | |
| 2011/0284068 A1 | 11/2011 | Moslehi et al. | |
| 2012/0012160 A1 | 1/2012 | Moslehi et al. | |
| 2012/0017971 A1 | 1/2012 | Moslehi et al. | |
| 2012/0017988 A1 | 1/2012 | Moslehi et al. | |
| 2012/0021560 A1 | 1/2012 | Moslehi et al. | |
| 2012/0028399 A1 | 2/2012 | Moslehi et al. | |
| 2012/0085278 A1 | 4/2012 | Moslehi et al. | |
| 2012/0103408 A1 | 5/2012 | Moslehi et al. | |
| 2012/0122272 A1 | 5/2012 | Rana et al. | |
| 2012/0125256 A1 | 5/2012 | Kramer et al. | |
| 2012/0145553 A1 | 6/2012 | Kramer et al. | |
| 2012/0167819 A1 | 7/2012 | Kramer et al. | |
| 2012/0171804 A1 | 7/2012 | Moslehi et al. | |
| 2012/0174860 A1 | 7/2012 | Moslehi et al. | |
| 2012/0174861 A1 | 7/2012 | Wang et al. | |
| 2012/0178203 A1 | 7/2012 | Moslehi et al. | |
| 2012/0180867 A1 | 7/2012 | Moslehi et al. | |
| 2012/0192789 A1 | 8/2012 | Kramer et al. | |
| 2012/0225515 A1 | 9/2012 | Moslehi et al. | |
| 2013/0020206 A1 | 1/2013 | Wuebben et al. | |
| 2013/0154061 A1 | 6/2013 | Hayashi et al. | |
| 2015/0159292 A1 | 6/2015 | Kramer et al. | |
| 2015/0299892 A1 | 10/2015 | Moslehi et al. | |
| 2015/0308008 A1 | 10/2015 | Miyaji et al. | |
| 2015/0315719 A1 | 11/2015 | Kamian et al. | |

FOREIGN PATENT DOCUMENTS

| | | |
|---|---|---|
| DE | 41 41 083 A1 | 6/1993 |
| EP | 0 334 330 A2 | 9/1989 |
| EP | 0 597 428 A1 | 5/1994 |
| EP | 0 879 902 A2 | 11/1998 |
| EP | 1 024 523 A1 | 2/2000 |
| EP | 0989593 A2 | 3/2000 |
| EP | 1 054 458 A2 | 11/2000 |
| EP | 1059663 A2 | 12/2000 |
| JP | 02-154343 A | 6/1990 |
| JP | H05-198558 A | 8/1993 |
| JP | H06-151406 A | 5/1994 |
| JP | 06-260670 A | 9/1994 |
| JP | H08-181103 A | 7/1996 |
| JP | H09 255487 A | 9/1997 |
| JP | H10-275798 A | 10/1998 |
| JP | H10-312990 A | 11/1998 |
| JP | 2002184709 A | 6/2002 |
| JP | 2002-299661 A | 10/2002 |
| JP | 2004 172496 A | 6/2004 |
| JP | 2007-224375 A | 9/2007 |
| JP | 2008177563 A | 7/2008 |
| WO | WO 96/41368 | 12/1996 |
| WO | PCT/EP99/08573 | 5/2000 |
| WO | WO/02/055760 | 7/2002 |
| WO | WO/2010/083422 | 7/2010 |
| WO | WO/2010/129719 | 11/2010 |
| WO | WO 2011/100647 | 8/2011 |
| WO | WO/2012/040688 | 3/2012 |
| WO | WO/2013/126033 | 8/2013 |

OTHER PUBLICATIONS

C. Berge, 150-mm Layer Transfer for Monocrystalline Silicon Solar Cells, Solar Energy Materials & Solar Cells, 2006, pp. 3102-3107, vol. 90, Elsevier B.V.

C. Oules et al, Silicon on Insulator Structures Obtained by Epitaxial Growth of Silicon over Porous Silicon, Journal of the Electrochemical Society, Inc., 1992, p. 3595, vol. 139, No. 12, Meylan Cedex, France.

C.S. Solanki, et al, Porous Silicon Layer Transfer Processes for Solar Cells, Solar Energy Materials & Solar Cells, 2004, pp. 101-113, vol. 83, Elsevier B.V., Leuven, Belgium.

C.S. Solanki, et al, Self-Standing Porous Silicon Films by One-Step Anodizing, Journal of Electrochemical Society, 2004, pp. C307-C314, vol. 151, The Electrochemical Society, Inc., Leuven, Belgium.

F. Duerinckx, et al, Reorganized Porous Silicon Bragg Reflectors for Thin-Film Silicon Solar Cells, IEEE Electron Device Letters, Oct. 2006, vol. 27, No. 10.

Francois J. Henley, Layer-Transfer Quality Cleave Principles, SiGen, Jul. 8, 2005, pp. 1-6, The Silicon Genesis Corporation, San Jose, California.

H.J. Kim, et al, Large-Area Thin-Film Free-Standing Monocrystalline Si Solar cells by Layer Transfer, Leuven, Belgium, IEEE.

J.H. Werner et al, From Polycrystalline to Single Crystalline Silicon on Glass, Thin Solid Films, 2001, pp. 95-100, vol. 383, Issue 1-2, Elsevier Science B.V., Germany.

J.J. Schermer et al., Epitaxial Lift-Off for large area thin film III/V devices, phys. Stat. sol. (a) 202, No. 4, 501-508 (2005).

Jianhua Zhao, et al, A 19.8% Efficient Honeycomb Multicrystalline Silicon Solar Cell with Improved Light Trapping, IEEE Transactions on Electron Devices, 1999, vol. 46, No. 10.

K. Van Nieuwenhuysen et al., Progress in epitaxial deposition on low-cost substrates for thin-film crystalline silicon solar cells at IMEC, Journal of Crystal Growth, 2006, pp. 438-441, vol. 287, Elsevier B.V., Leuven, Belgium.

K.L. Chopra et al., Thin-Film Solar Cells: An Overview, Progress in Photovoltaics: Research and Applications, 2004, pp. 69-92, vol. 12, John Wiley & Sons, Ltd.

Lammert et al., The Interdigitated Back Contact Solar Cell: A Silicon Solar Cell for Use in Concentrated Sunlight, IEEE Transactions on Electron Devices, pp. 337-342.

MacDonald et al., "Design and Fabrication of Highly Topographic Nano-imprint Template for Dual Damascene Full 3-D Imprinting," Dept. of Chemical Eng., University of Texas at Austin, Oct. 24, 2005.

Martin A. Green, Consolidation of Thin-Film Photovoltaic Technology: The Coming Decade of Opportunity, Progress in Photovoltaics: Research and Applications, 2006, pp. 383-392, vol. 14, John Wiley & Sons, Ltd.

Martin A. Green, Silicon Photovoltaic Modules: A Brief History of the First 50 Years, Progress in Photovoltaics: Research and Applications, 2005, pp. 447-455, vol. 13, John Wiley & Sons, Ltd.

Nobuhiko Sato et al, Epitaxial Growth on Porous Si for a New Bond and Etchback Silicon-on-Insulator, Journal of Electrochemical Society, Sep. 1995, vol. 142, No. 9, The Electrochemical Society, Inc., Hiratsuka, Japan.

(56) References Cited

OTHER PUBLICATIONS

P.J.Verlinden, et al, Sliver® Solar Cells: A New Thin-Crystalline Silicon Photovoltaic Technology, Solar Energy Materials & Solar Cells, 2006, pp. 3422-3430, vol. 90, Elsevier B.V.

P.R. Hageman et al., Large Area, Thin Film Epitaxial Lift Off III/V Solar Cells, 25th PVSC, May 13-17, 1996, Washington D.C., IEEE.

Photovoltaic Technology Research Advisory Council, A Vision for Photovoltaic Technology, 2005, pp. 1-41, European Commision Publications Office.

Prometheus Institute, U.S. Solar Industry Year in Review: U.S. Solar Energy Industry Charging Ahead, (SEIA) The Solar Energy Industry Association.

R.Brendel, et al, Sol-Gel Coatings for Light Trapping in Crystalline Thin Film Silicon Solar Cells, Journal of Non-Crystalline Solids, 1997, pp. 391-394, vol. 218, Elsevier Science B.V., Germany.

R.B. Bergmann, Crystalline Si Thin-Film Solar Cells: A Review, 1999, pp. 187-194, vol. 69, Applied Physics A Materials Science and Processing, Springer-Verlag.

Richard Auer et al, Simplified Transfer Process for High-Current Thin-Film Crystalline Si Solar Modules, 3rd World Conference on Photovoltaic Energy Conversion, May 11-18, 2003, Osaka, Japan.

Richard M. Swanson, A Vision for Crystalline Silicon Photovoltaics, Progress in Photovoltaics: Research and Applications, 2006, pp. 443-453, vol. 14, John Wiley & Sons, Ltd.

Rolf Brendel, A Novel Process for Ultrathin Monocrystalline Silicon Solar Cells on Glass, 14th European Photovolaic Solar Energy Conference, Jun. 30-Jul. 4, 1997, Barcelona, Spain.

Rolf Brendel, Review of Layer Transfer Processes for Cystalline Thin-Film Silicon Solar Cells, The Japan Journal of Applied Physics, 2001, pp. 4431-4439, vol. 40, Part 1, No. 7, The Japan Society of Applied Physics, Japan.

Rolf Brendel, Thin-Film Crystalline Silicone Mini-Modules Using Porous Si for Layer Transfer, Solar Energy, 2004, pp. 969-982, vol. 77, Elsevier Ltd., Germany.

S. Hegedus, Thin Film Solar Modules: The Low Cost, High Throughput and Versatile Alternative to Si Wafers, Progress in Photvoltaics: Research and Applications, 2006, pp. 393-411, vol. 14, John Wiley & Sons, Ltd.

Takao Yonehara, et al, Epitaxial Layer Transfer by Bond and Etch Back of Porous Si, Applied Physics Letter 64, Apr. 18, 1994, vol. 16, American Institute of Physics.

Toshiki Yagi, et al, Ray-Trace Simulation of Light Trapping in Silicon Solar Cell with Texture Structures, Solar Energy Materials & Solar Cells, 2006, pp. 2647-2656, vol. 90, Elsevier B.V.

PCT International Search Report and Written Opinion dated Oct. 18, 2011 issued in PCT/US2011/024670.

PCT International Preliminary Report on Patentability dated Aug. 14, 2012 issued in PCT/US2011/024670.

EP Extended Search Report dated Apr. 1, 2015 issued in EP 11742933.2.

* cited by examiner

APPARATUS FOR FORMING POROUS SILICON LAYERS ON AT LEAST TWO SURFACES OF A PLURALITY OF SILICON TEMPLATES

CROSS-REFERENCE TO RELATED APPLICATIONS

This application is a continuation of U.S. Non-Provisional Ser. No. 13/026,239, filed Feb. 12, 2011 which claims priority to U.S. Provisional Patent Application Ser. No. 61/304,340, filed Feb. 12, 2010, both of which are hereby incorporated by reference in its entirety. Other related applications having common inventorship and/or ownership are mentioned throughout this disclosure, and they are also incorporated by reference in their entirety.

FIELD

This disclosure relates in general to the field of photovoltaics and microelectronics, and more particularly to fabrication processes and manufacturing equipment for forming porous silicon layers on at least two surfaces of a plurality of silicon templates. This disclosure provides for such manufacturing at low costs and high throughputs.

BACKGROUND

Currently, crystalline silicon has the largest market share in the photovoltaics (PV) industry, accounting for over 80% of the overall PV market share. Although going to thinner crystalline silicon solar cells is long understood to be one of the most potent ways to reduce PV cost (because of the relatively high material cost of crystalline silicon wafers used in solar cells as a fraction of the total PV module cost), it is fraught with the problem of mechanical breakage due to the thin and large substrate sizes, and also to some extent that of light trapping in a thin structure (since silicon is an indirect band-gap semiconductor material). The requirement of high mechanical yield and reduced wafer breakage rate is further problematic with the realization that for cost-effectiveness, the yields in PV manufacturing factories must be very high. On a standalone crystalline silicon solar cell (without support), going even somewhat below the current thickness range of 140-250 microns starts to severely compromise mechanical yield during manufacturing. Thus, any solution to process very thin solar cell structures must either be fully supported by a host carrier throughout the cell process or use a novel self-supporting, standalone, substrate with an accompanying structural innovation.

Innovative manufacturing processes to produce solar cells at low costs using thin-film semiconductor substrates (TF-SSs) as the active material have been disclosed in related applications. In some embodiments, the TFSSs comprise crystalline semiconductor (more specifically silicon in some embodiments). This technology platform produces solar cells from re-usable semiconductor templates. In certain embodiment, the surfaces of the templates have a periodic array of pre-structured 3-dimensional (3-D) structures. Examples of the 3-D TFSS based solar cells include but are not limited to prism honey-comb and inverted pyramidal cavities, which are described in earlier applications having common inventorship and/or ownership. The following are examples of related applications.

U.S. Patent Publications US2008/0157283 A1, US2008/0289684 A1, US2010/0148318 A1, US2010/0300518; U.S. patent application Ser. No. 13/057,104; PCT Application Serial Nos. PCT/US10/60591, PCT/US10/62614.

As disclosed by the above documents, the epitaxial substrate is grown on top of a reusable template and is subsequently dislodged. In one embodiment, the template and substrate each comprise monocrystalline silicon. Afterwards, the reusable template may be reused several times, with or without reconditioning, to grow more epitaxial substrates. The reusable template has a planar top surface or a top surface with pre-formed 3-D microstructures, such as hexagonal honey-comb cavities or inverted pyramidal cavities. The releasing of the 3-D TFSS is achieved with an interim sacrificial layer. The sacrificial layer should satisfy two important criteria. First, it needs to transfer the information on crystallinity from the reusable template to the epitaxial layer. Second, it should be able to be removed selectively compared to the substrate and the reusable template. One specific embodiment of the sacrificial layer is porous silicon, whose porosity can be modulated to achieve both the aforementioned critical functions.

As disclosed by the above documents, the planar or 3-D TFSSs are made and released from one-side, i.e., the top surface of a reusable template. In other words, one solar substrate is made from a reusable template in each of its reuse cycles. In those disclosures, the template and substrate making equipment, and the porous silicon forming and epitaxial silicon growing equipment is capable of processing on only one side of the silicon template. The equipment is capable of processing multiple wafers at a time in a batching processing mode, but only one side of each template is used.

Solar cell manufacturing requires much higher productivity with much lower costs compared with semiconductor processes. Therefore, there it may be advantageous to develop manufacturing processes and equipment capable of making thin semiconductor substrates from both sides of a reusable template simultaneously.

SUMMARY

In order to reduce the thin-film crystalline semiconductor (such as silicon) substrate manufacturing costs and increase the production throughputs, this disclosure provides manufacturing methods and apparatus designs for forming porous silicon layers on at least two surfaces of a plurality of silicon templates, thus effectively increasing the substrate manufacturing throughput and reducing the substrate manufacturing cost. This approach also reduces the amortized starting template cost per manufactured substrate (TFSS) by about a factor of two for a given number of template reuse cycles.

In accordance with the present disclosure, an apparatus for forming porous silicon layers on at least two surfaces of a plurality of silicon templates in a batch electrochemical anodic etch process is provided. The apparatus comprises a plurality of edge-sealing template mounts operable to prevent formation of porous silicon at the edges of a plurality of templates. An electrolyte is disposed among the plurality of templates. The apparatus further comprises a power supply operable to switch polarity, change current intensity, and control etching time to produce the porous silicon layers.

In yet another embodiment, the apparatus for forming porous silicon layers on at least two surfaces of a plurality of silicon templates in a batch electrochemical anodic etch process further comprises an electrolyte temperature controller.

In yet another embodiment, the apparatus for forming porous silicon layers on at least two surfaces of a plurality of silicon templates in a batch electrochemical anodic etch process further comprises an external liquid circulation and gas bubble extractor.

In yet another embodiment, an apparatus for forming porous silicon layers on at least two surfaces of a plurality of silicon templates in a batch electrochemical anodic etch process is provided. The apparatus comprises a plurality of edge-sealing template mounts operable to prevent formation of porous silicon at the edges of a plurality of templates. An electrolyte is disposed among the plurality of templates. The apparatus further comprises an electrolyte temperature controller. The apparatus further comprises an external liquid circulation and gas bubble extractor. The apparatus further comprises a power supply operable to switch polarity, change current intensity, and control etching time to produce the porous silicon layers.

In yet another embodiment, the template may be reconditioned and cleaned as needed followed by a reuse cycle. Each template in this disclosure may be used multiple cycles until it becomes too thin to handle or until it loses its structural properties. In those cases, the used templates may be recycled.

BRIEF DESCRIPTION OF THE DRAWINGS

The features, nature, and advantages of the disclosed subject matter will become more apparent from the detailed description set forth below when taken in conjunction with the drawings, in which like reference numerals indicate like features and wherein.

DETAILED DESCRIPTION

Although the present disclosure is described with reference to specific embodiments, one skilled in the art could apply the principles discussed herein to other areas and/or embodiments without undue experimentation.

Figure 1A:
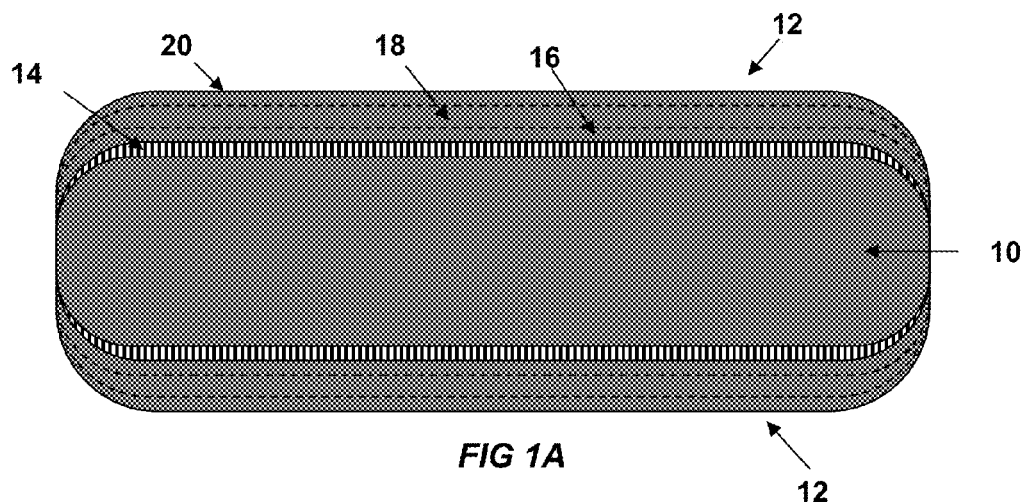
FIGS. 1A and 1B illustrate cross-sectional schematic drawings of a double-sided planar template before and after its TFSS releasing, respectively.
Figure 1B:
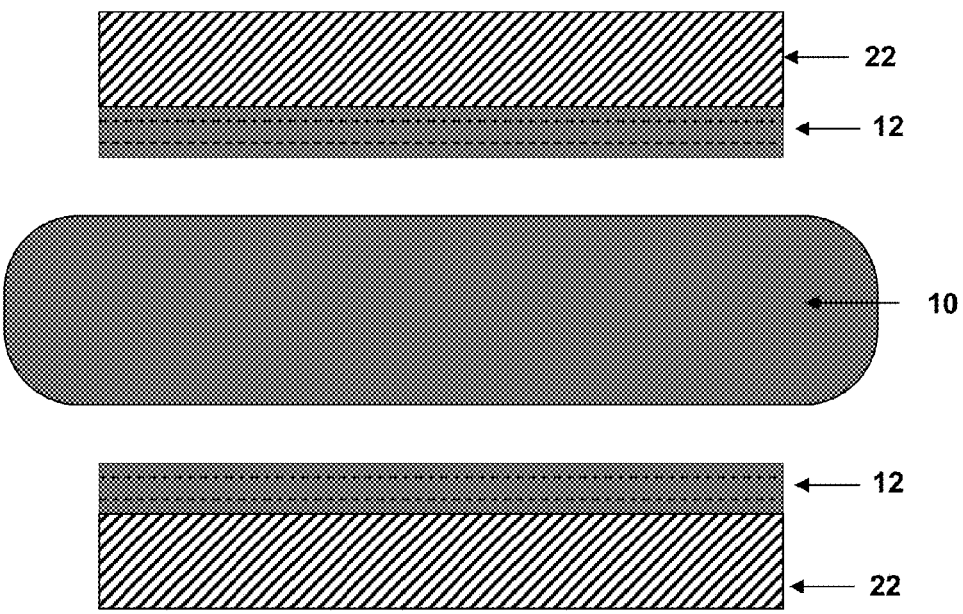

FIG. 1A and FIG. 1B illustrate cross-sectional schematic drawings of double-sided planar template 10 before and after TFSSs 12 are released from both sides. As illustrated in FIG. 1A, epitaxially grown silicon layers are formed, in some embodiments concurrently, by an epitaxial silicon growth process, on both sides of a planar template and on top of porous silicon layers 14 on the template frontside and backside surfaces. The template may be made of a monocrystalline silicon wafer with polished surfaces surface (although wafers with non-polished surfaces and/or polycrystalline or multicrystalline silicon wafers may also be used as templates). The wafer diameter may be in the range of approximately 150 to 450 mm and the wafer thickness may be in the range of approximately 0.5 to 1 mm. Even thicker wafers may be used, up to several millimeters in thickness. The template may be in a circular shape, a square/rectangular shape, or a pseudo-square/pseudo-rectangular shape with rounded corners. The porous silicon layer may consist of a single layer, a bilayer or multilayer having different porosities, or a graded porosity layer. For example, the porous silicon sub-layer that contacts the template may have a higher porosity than the sub-layer that contacts the epitaxial layer. The overall epitaxial layer thickness may be in the range of approximately 1 to 100 microns and it may consist of layers of different types and levels of doping. For example for solar cell applications, thin layer 16 that makes contact to the buried porous silicon layer may be $n^+$ (phosphorous) doped to form the front-surface-field (FSF) of the solar cell; middle layer 18 may be n (phosphorous) doped to form the base region of the solar cell; and outer epitaxial layer 20 may be $p^+$ (boron) doped to form the emitter region of the solar cell (or alternatively with opposite doping polarities for solar cells with p-type base).

The epitaxial layer on the wafer edge may be removed (as shown in FIG. 1B) to expose the buried porous silicon layer so that the epitaxial layers may be released from the template. Alternatively, the epitaxial layers may be prevented from growing at the template edges by mechanical shadowing and/or a hydrogen gas flow depletion purge. In another alternative method, the TFSS edges are defined by laser trench cutting with the cutting depth no larger than approximately the epitaxial layer thickness. In this method, the remaining epitaxial silicon layers at template edges may be removed after the TFSS is released by template edge lapping, grinding or polishing. As illustrated in FIG. 1B, the epitaxial layers are released from the template to form TFSSs with optional reinforcement/support plates 22. The thin silicon reinforcement or support plates may be temporarily or permanently mounted on the TFSSs to enhance their handle-ability during subsequence solar cell processing steps. As disclosed in related applications, the reinforcement plates may be made from solar grade glass, polymers, or other materials. There also may be solar grade adhesive layers used for making permanent bond between the reinforcement plate and TFSS. In the case that the epitaxial layer is thicker than about 50 microns and the TFSS size is smaller than about 150 mm in diameter, the reinforcement plates may not be needed. After the TFSS releasing, the template may be cleaned, reconditioned (in this sequence or in the reverse sequence of reconditioning followed by cleaning) and then reused. The TFSSs then go through the subsequent solar cell making process, including but not limited to surface cleaning, doping, passivation and contact making steps as disclosed in related applications.

Figure 2A:
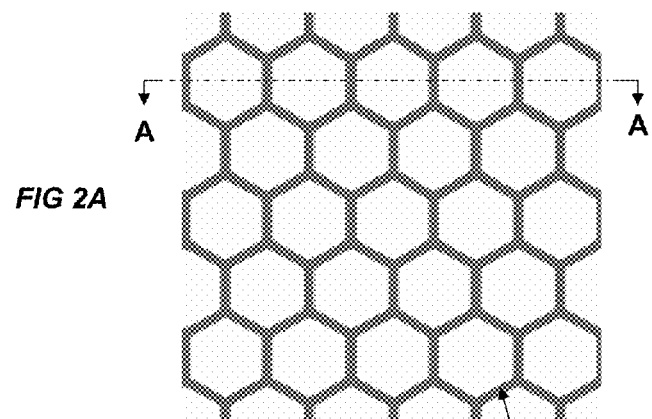
FIG. 2A illustrates a front view of a double-sided reusable template with hexagonal honeycomb interconnected trenches.
Figure 2B:
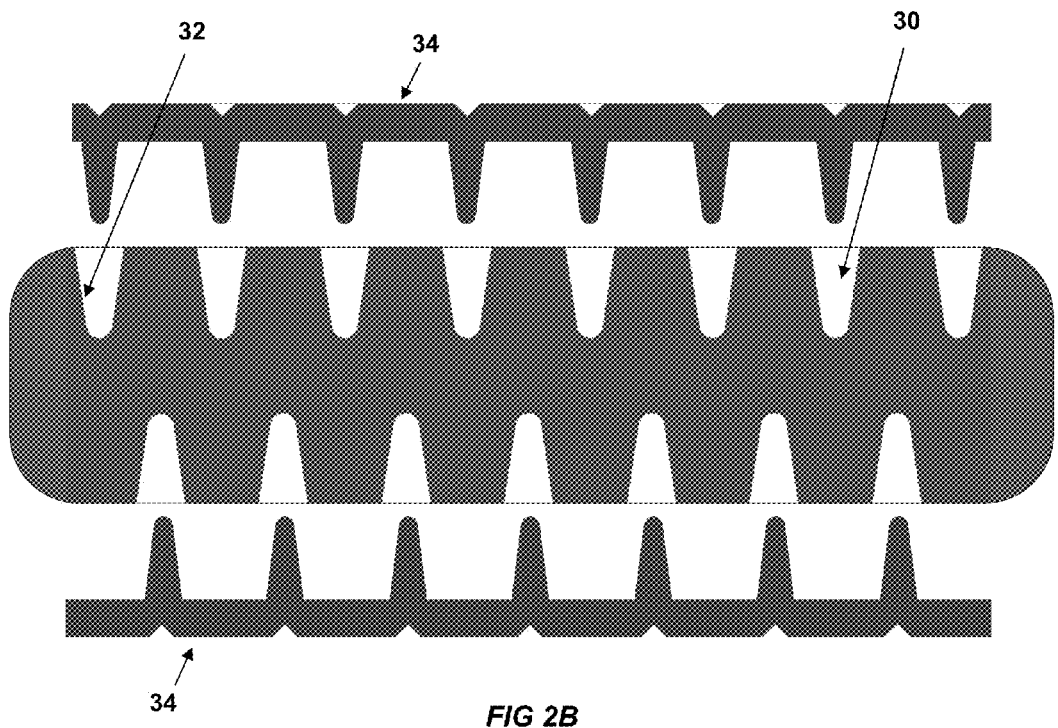
FIG. 2B illustrates a cross-sectional schematic drawing of a double-sided template with prism honey-comb 3-D structures and TFSSs released from both sides of the template.

FIGS. 2A and 2B illustrate a double-sided template with hexagonal honeycomb 3-D structures and TFSSs made from both sides of the reusable template. FIG. 2A illustrates a partial front-view schematic drawing of the template. The template may be made of a monocrystalline silicon wafer, although polycrystalline or multicrystalline wafers may also be used as templates. The template has pre-structured front and back side surfaces. More specifically, sidewall tapered hexagonal honeycomb trenches 30 are made in the silicon template on both of its sides. FIG. 2B illustrates a cross-sectional schematic drawing (along the A-A cut direction) of the template after the release of TFSSs 34 (the drawing dimensions are not shown to scale). As shown, trench sidewalls 32 are tapered and the taper angle may be from several degrees to tens of degrees (in some embodiments approximately 3 to 10 degrees). The trench height may be approximately 50 to 300 microns, or more specifically in some embodiments 75 to 150 microns. The top trench width may be approximately 10 to 100 microns, or more specifically in some embodiments 20 to 50 microns. The backside structures may be misaligned to the front side structures to ensure increased template mechanical strength. The template wafer diameter is in the range of approximately 150 to 450 mm, and the wafer thickness is approximately in the range of 0.5 to over 1 mm (even thicker wafers may be used, up to several mm in thickness). Porous silicon layers (not shown) are initially formed on both sides of the template surfaces, as discussed in the planar TFSS case. Then epitaxially grown silicon layers are formed on both sides of the template on top of the porous silicon layers. The epitaxial layer thickness is in the range of about 1 to 100 microns and it may consist of various doping types and levels across its depth, as explained in the planar TFSS case. For simplicity of schematic drawing purpose, the doping types and levels are not shown in FIG. 2B. In order to release the epitaxial layers from the template, the epitaxial layer on the wafer edge is removed to expose the buried porous silicon layer.

Alternatively, the epitaxial growth is prevented from growing at template edges by mechanical shadowing. In another alternative method, the TFSS edges are defined by laser trench cutting with the cutting depth is no larger than approximately the epitaxial layer thickness. In this method, the remaining epitaxial silicon layers at template edges may be removed after TFSS release by template edge lapping, grinding or polishing. As illustrated in FIG. 2B, the epitaxial layers are released from the template to form free-standing TFSSs without the needs of reinforcement plates. After TFSS release, the template may be cleaned, reconditioned and then reused. The TFSSs then go through the subsequent solar cell making process, including but not limited to surface cleaning, doping, passivation and contact making steps as disclosed in related applications.

Figure 3A:
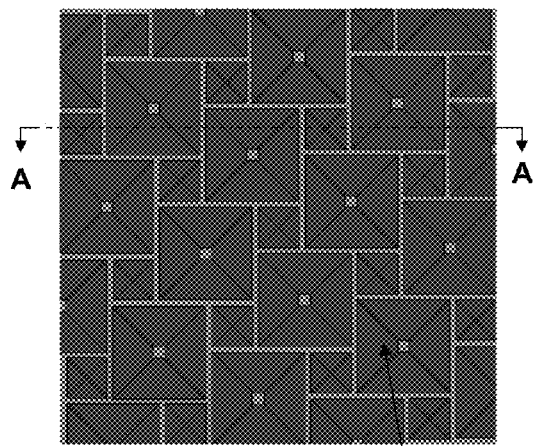
FIG. 3A illustrates a front-view schematic drawing of a double-sided reusable template with inverted pyramidal cavities.
Figure 3B:
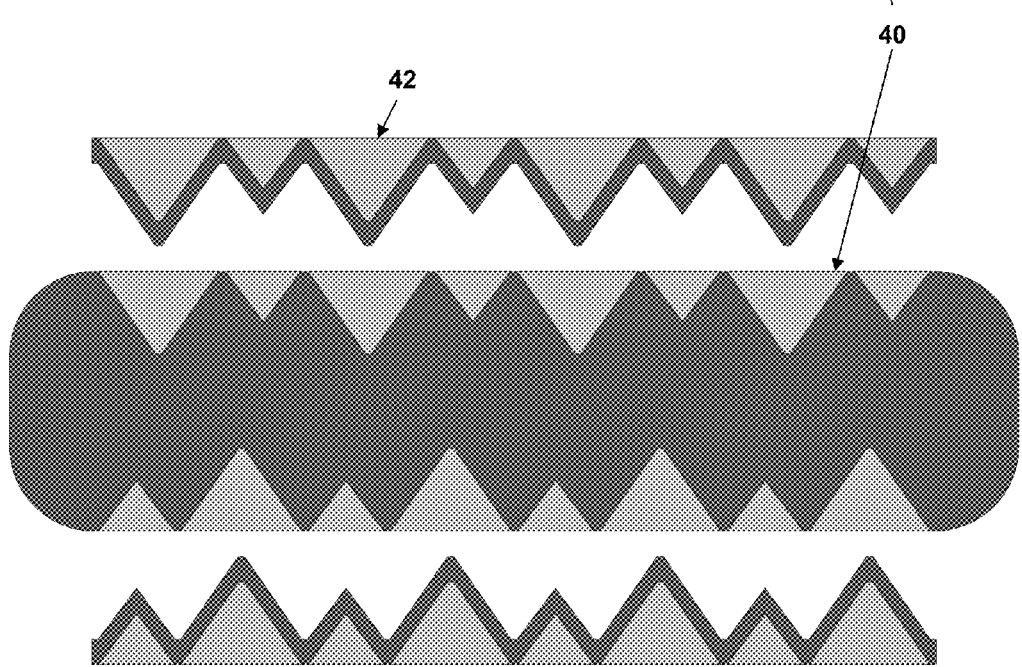
FIG. 3B illustrates a schematic drawings of a double-sided template with inverted pyramid 3-D structures and TFSSs released from both sides of the template.

FIGS. 3A and 3B illustrate a double-sided template with inverted pyramid 3-D structures and TFSSs made from both sides of the reusable template. FIG. 3A illustrates a partial front-view schematic drawing of the template. The template may be made of a monocrystalline silicon wafer, although polycrystalline or multicrystalline wafers may also be used as templates. The template has pre-structured front and back side surfaces. More specifically, inverted pyramidal cavities 40 are made into the silicon template on both of its sides. To facilitate formation of the pyramidal pattern, the template may be a (100) monocrystalline silicon wafer. The inverted pyramidal cavities are aligned to the (100) directions and have their sidewalls etched to (111) crystallographic planes of mono-crystalline silicon. The sidewalls have 54.7° angles against the top lateral plane. The cavity top openings are in the range of approximately 50 to 500 microns and depths are in the range of approximately 50 to 250 microns. FIG. 3B illustrates a cross-sectional schematic drawing (along the A-A cut direction) of the template after the release of TFSSs 42 (the drawing dimensions are not shown to scale). The back side structures may be misaligned to the front side structures to ensure increased template mechanical strength. The template wafer diameter may be in the range of approximately 150 to 450 mm, and the wafer thickness may be approximately in the range of 0.5 to 1 mm (or even a few mm). As described above, a porous silicon layer or layers may be formed on both sides of the template. Then epitaxially grown silicon layers are formed on both sides of the template on top of the porous silicon layers. The epitaxial layer thickness is in the range of about 1 to 100 microns and it may consist of various doping types and levels across its depth, as explained in the planar TFSS case. For simplicity of schematic drawing purpose, the doping types and levels are not shown in FIG. 3B. In order to release the epitaxial layers from the template, the epitaxial layer on the wafer edge is removed to expose the buried porous silicon layer.

Alternatively, the epitaxial layer is prevented from growing at template edges by mechanical shadowing. In another alternative method, the TFSS edges are defined by laser trench cutting with the cutting depth no larger than approximately the epitaxial layer thickness. In this method, the remaining epitaxial silicon layers at template edges may be removed after the TFSS releasing by template edge lapping, grinding or polishing.

As illustrated in FIG. 3B, the epitaxial layers are released from the template to form free-standing TFSSs without the need for reinforcement plates. After the TFSS releasing, the template may be cleaned, reconditioned and then reused. The TFSSs then go through the subsequent solar cell making process, including but not limited to surface cleaning, doping, passivation and contact making steps as disclosed in related applications.

Figure 4:
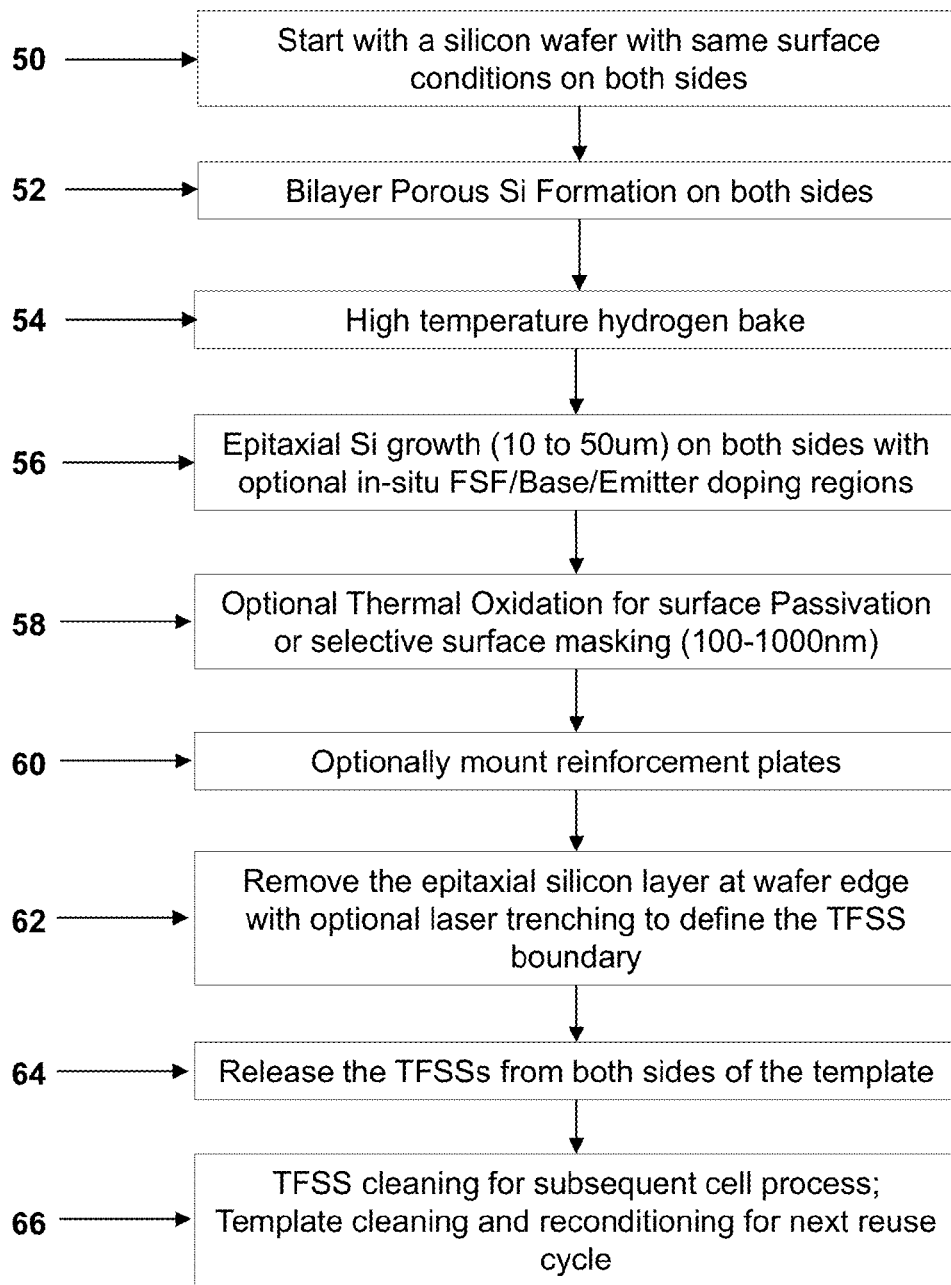
FIG. 4 illustrates a block diagram of making planar TFSSs using the double-sided re-usable template.

FIG. 4 outlines the major process steps in one embodiment of a process flow for making planar TFSSs using the double-sided re-usable template approach of this disclosure. The fabrication process starts at step 50 from a substantially planar template, which may be a monocrystalline (100) silicon wafer. The starting wafer could be in circular or square or rectangular or polygonal shapes. Both sides of the template surface may be the same in term of their surface finishes, or they may be different. In one embodiment, the front and back surfaces are non-textured and polished. In another embodiment, shallow (e.g. less than about 10 microns) and random textures are formed on both sides of the template surfaces. The (100) silicon wafer surface texturing processes are known in the prior arts and are usually conducted by diluted alkaline chemistry, such as KOH or NaOH silicon etching.

At step 52, a porous silicon layer is formed by electrochemical anodic HF etching of silicon on both the front and back sides of the template surfaces. During the porous silicon forming in an HF/IPA (or HF/acetic acid) solution, the electrical current polarity is periodically switched between positive and negative currents so that each template side is successively etched in order to form the bilayer or multi-layer porous silicon structure on both template sides. In addition to the periodical current polarity switching, the current intensity is also changed in a controlled manner to form a porous silicon bilayer or multilayer that consists of the desired different (low and high) porosities. The first thin porous silicon layer is on the top and is first formed from the bulk silicon wafer. The first thin layer has a lower porosity of approximately 15% to 30%. The second thin porous silicon layer is directly grown from the bulk silicon and is underneath the first thin layer of porous silicon. The second thin porous silicon layer may have a higher porosity in the range of approximately 40%-80%. The top lower porosity layer is used as a crystalline seed layer for high quality epitaxial silicon growth, and the underneath higher porosity porous silicon layer is used for facilitating TFSS releasing due to its low-density physical connections (between the epitaxial and bulk silicon interfaces) and its weak mechanical strength.

Alternatively, a single porosity release layer with a progressively increased porosity from top to bottom can also be used. In this case, the top portion of the porous silicon layer has a low porosity of approximately 15% to 30%, and the lower portion of the porous silicon layer has a high porosity of approximately 40% to 80%, with a region of graded porosity in between.

At step 54, and before the epitaxial silicon growth, the wafer is baked in a high temperature (at approximately 950° C. to 1200° C., and more specifically in some embodiments in the range of 1050° C. to 1150° C.) hydrogen environment within the epitaxial silicon deposition reactor in order to form coalesced structures (with relatively large voids) within the higher-porosity buried porous silicon layer while forming a continuous surface seed layer of crystalline silicon on the top of the lower-porosity porous silicon layer.

Next, at step 56, a mono-crystalline epitaxial silicon layer is concurrently deposited on both sides of the template, preferably in a high-throughput large-batch epitaxial furnace. The epitaxial layer may be in-situ doped. For example for solar cell applications, the bulk base of the epitaxial layer may be n (phosphorous) doped, the inner layer may be $n^+$ (phosphorous) doped to form the FSF, and the outer layer may be p (boron) doped to form the emitter region of the solar cell. The thickness of the epitaxial layer is in the range of 1 to 100 microns.

In optional step 58, a thin oxide layer is thermally grown on the epitaxial surface. The thin oxide layer may be used for solar cell surface passivation or a masking layer for subsequent selective surface openings.

In optional step 60, temporary or permanent reinforcement plates are mounted on the front and back silicon surfaces. The reinforcement plates also serve as carriers for enabling handling and processing thin TFSSs using commercially available solar cell manufacturing equipment, as disclosed in PCT application serial nos. PCT/US10/60591 and PCT/US10/62614.

Next, at step 62, the epitaxial layer on the wafer edge is removed by template edge lapping, grinding or polishing, to expose the buried porous silicon layer so that the epitaxial layers may be released from the template. Alternatively, the epitaxial growth is prevented from growing at template edges by mechanical shadowing. In another alternative method, as disclosed in related applications, the TFSS edges are defined by laser trench cutting the cutting depth no larger than approximately the epitaxial layer thickness.

In step 64, the optionally reinforced epitaxial layer of silicon is released/separated from the template, and the released epitaxial silicon layer is therefore referred as a thin film silicon substrate. Related applications disclose detailed methods of releasing the epitaxial layer to form a TFSS. In one of the disclosed methods, the TFSS is released in an ultrasonic DI-water bath. In another disclosed method, the TFSS is released by direct pulling with the wafer backside and the top epitaxial layer vacuum chucked.

In step 66, the released TFSS backside surface is cleaned by short silicon etching using KOH or TMAH solutions to remove the silicon debris and fully or partially remove the quasi-monocrystalline silicon (QMS) layer. In the meantime and after removal of the edge epitaxial silicon layer from the template, the template is cleaned by using diluted HF and diluted wet silicon etch solution, such as TMAH and/or KOH to remove the remaining porous silicon layers and silicon particles. Then the template is further cleaned by conventional silicon wafer cleaning methods, such as SC1 and SC2 wet cleaning (or the so-called RCA cleaning process) to removal possible organic and metallic contaminations. Finally, after proper rinsing with DI water and $N_2$ drying, the template is ready for another re-use cycle.

Figure 5A:
FIGS. 5A-5E illustrate cross-sectional schematic drawings of the planar TFSS making process, after major process steps, using the double-sided re-usable template.

FIGS. 5A-5E illustrate cross-sectional schematic drawings of the planar TFSS making process, after major processing steps, using the double-sided re-usable template. The dimensions in these drawings are not drawn to scale. FIG. 5A illustrates starting template 70 that has substantially planar front and back surfaces.

Figure 5B:
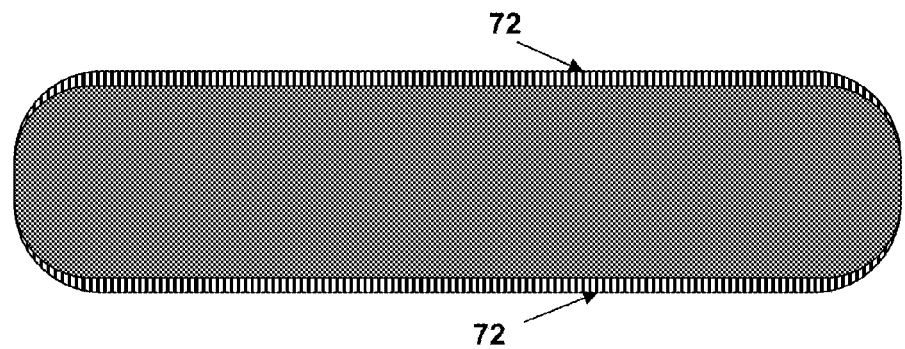

FIG. 5B illustrates the template after formation of porous silicon 72 on both its front and back surfaces. However, the porous silicon layers on the front and back surfaces are not connected, since there is no porous silicon formed on the very edge or bevel area of the template.

Figure 5C:
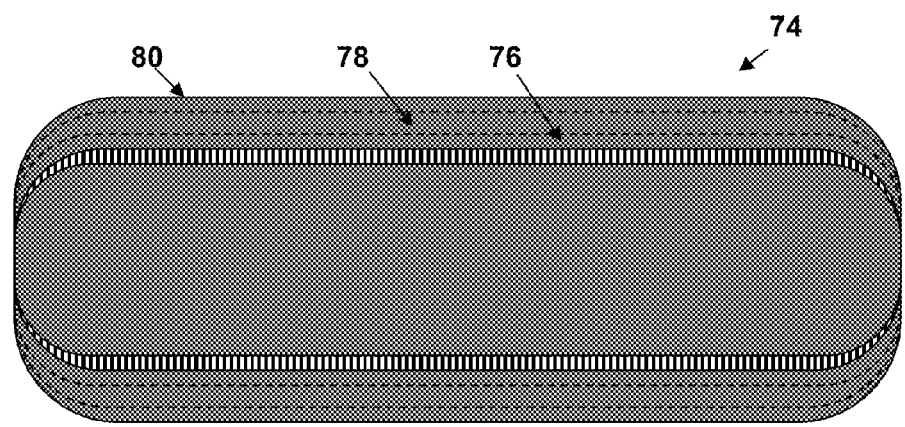

FIG. 5C illustrates the grown epitaxial layers 74 on both the front and back template surfaces. Epitaxial layers 74 in this example comprise $n^+$ doped FSF layer 76, n doped base 78, and $p^+$ doped emitter 80. Depending on the template holding configuration in the epitaxial growth chamber, there may or may not be thin epitaxial silicon layers grown on the very edge or bevel area of the template surface.

Figure 5D:
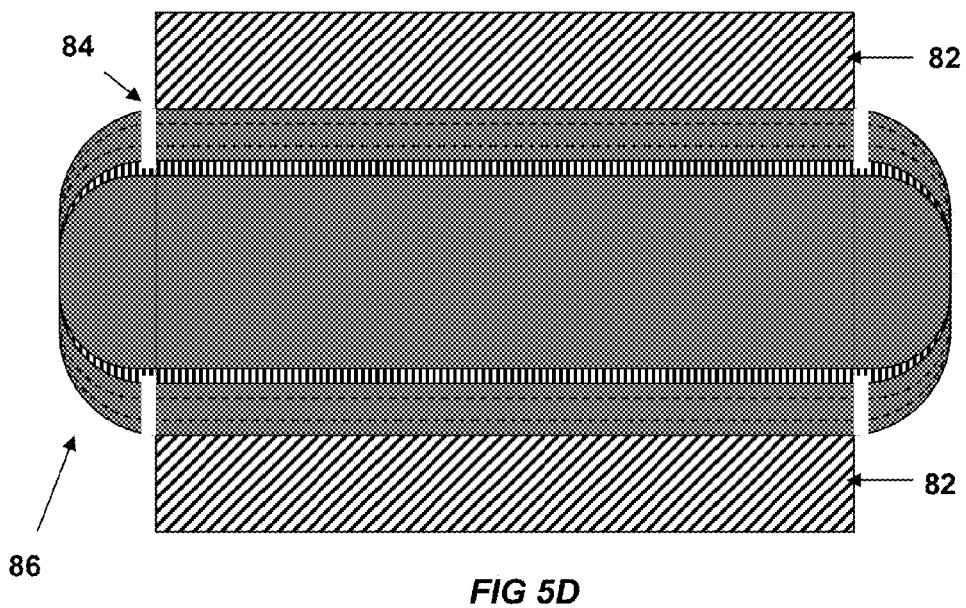

FIG. 5D illustrates the step after reinforcement plates 82 are mounted and border definition trenches 84 are made at the edges of the TFSS. Edge epitaxial layers 86 may be removed before or after TFSS separation.

Figure 5E:
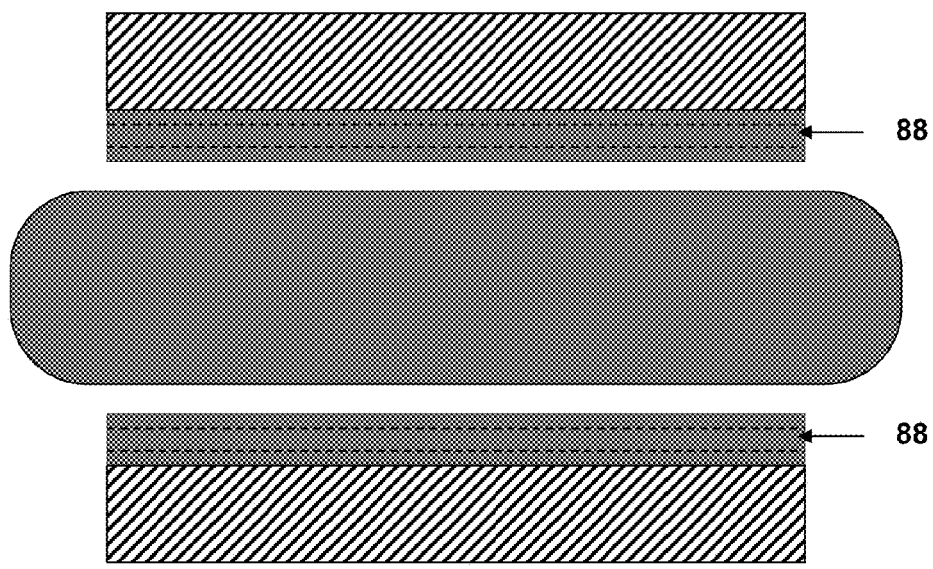

FIG. 5E illustrates the release of TFSSs 88 with the reinforcement plates. The separation of TFSSs 88 from the template surface happens in the buried porous silicon layers. The remaining porous silicon layers and/or QMS thin layers on the TFSS and template surfaces are etched off by wet chemical etching, such as diluted KOH or NaOH solution (or alternatively using an HF-nitric-acetic (HNA) solution), after the TFSS release. The remaining epitaxial and QMS silicon layers on the template edges are also removed or etched off prior to the next template reuse cycle.

Figure 6:
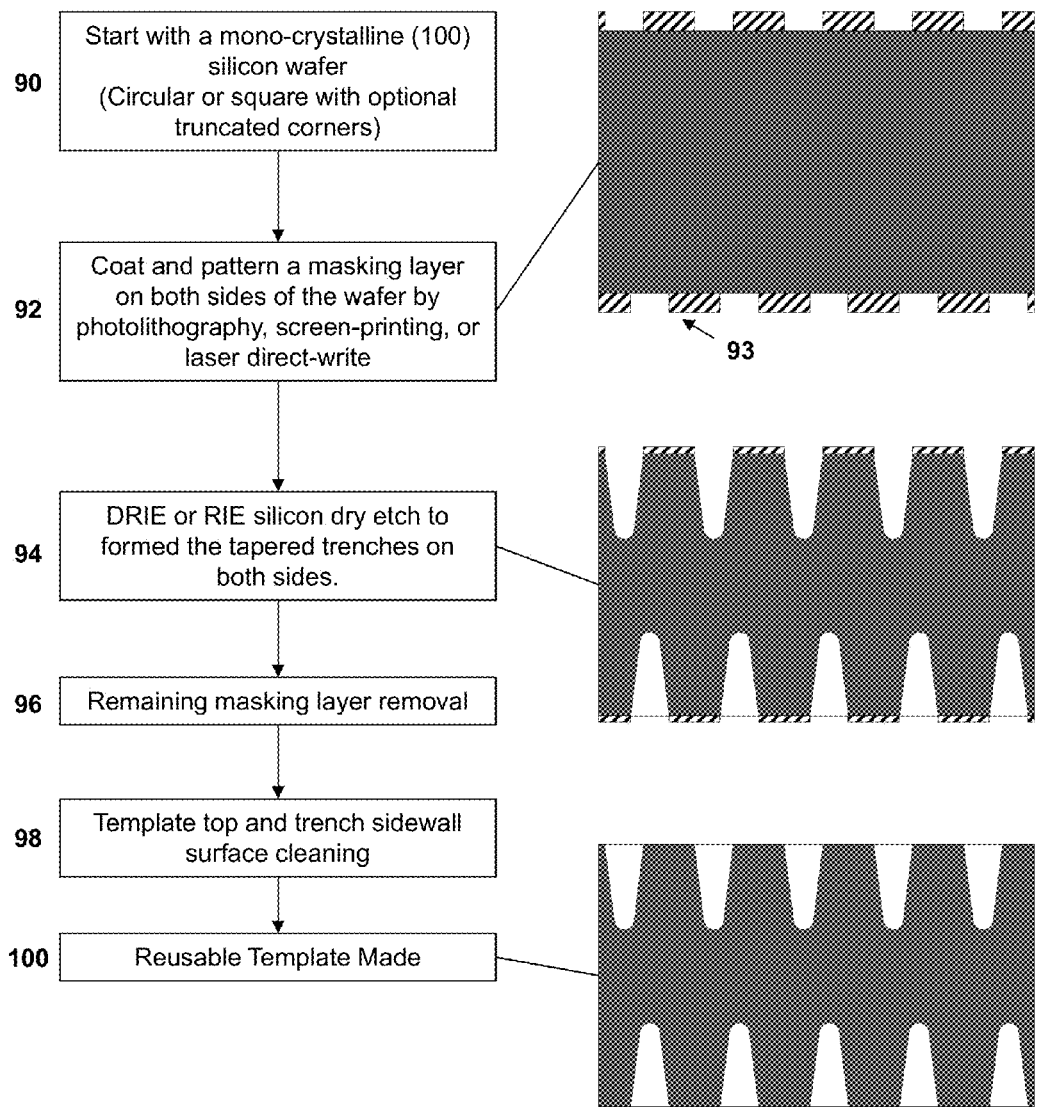
FIG. 6 illustrates major fabrication process steps for making double-sided re-usable template that have hexagonal honeycomb trenches.

FIG. 6 shows a process flow and illustrates the template after major fabrication process steps for making double-sided re-usable templates that have hexagonal honeycomb trenches. Such 3-D templates are used to make honeycomb TFSSs.

The template fabrication process starts at step 90 with a mono-crystalline (100) silicon wafer. In step 92, photoresist layers 93 are coated and patterned on both the front and back side surfaces of the template. Alternatively, resist layers could be screen printed.

Next, at step 94, the front and back side silicon trenches are etched in a deep-reactive-ion-etch (DRIE) or a reactive-ion-etch (RIE) process using silicon etching gases, such as $SF_6$. In the DRIE process, periodic surface passivation using $C_4F_8$ gas is performed to control the trench sidewall surfaces. The trench etching is time-controlled. After the trench etching, the remaining resist layer is removed at step 96, and all the exposed silicon surfaces are fully cleaned at step 98. Optionally, the trench sidewall rough surfaces are slightly etched to make them smoother. At step 100, the reusable template is complete.

The 3-D TFSS manufacturing process of using the double-sided honeycomb template is substantially the same as the planar TFSS making process, except the reinforcement plates may not be needed prior to the TFSS releasing. For simplicity, the 3-D TFSS making process is not shown in figures.

Figure 7:
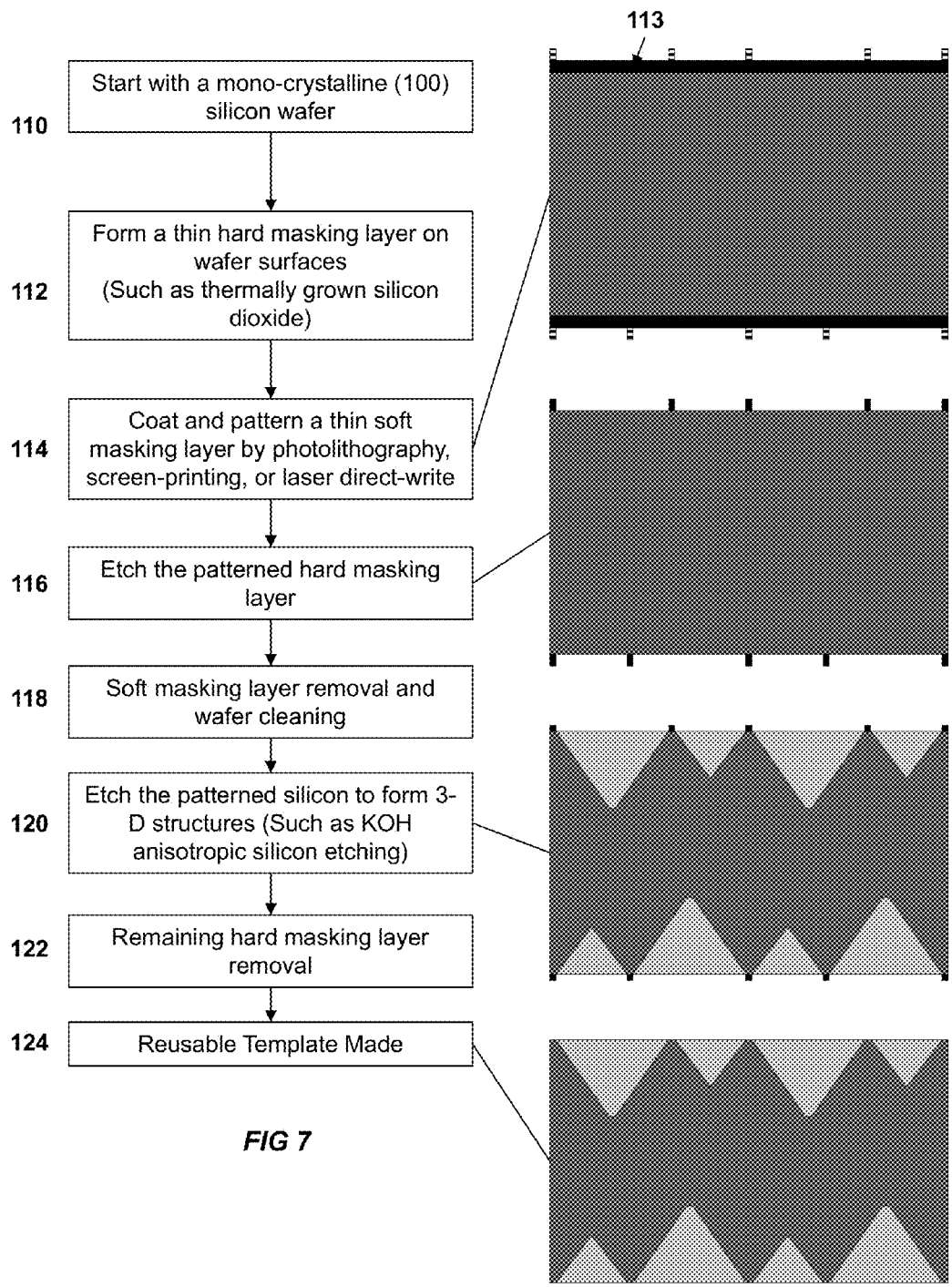
FIG. 7 illustrates major fabrication process steps for making double-sided re-usable templates that have inverted pyramidal cavities.

FIG. 7 illustrates major fabrication process steps for making double-sided re-usable templates that have inverted pyramidal cavities. Such 3-D templates are used to make pyramidal TFSSs. The template fabrication process starts at step 110 with a monocrystalline (100) silicon wafer. The thickness of the wafers is in the range of approximately 0.5 to 1 mm (or even a few mm). In step 112, a thermally grown oxide layer of about 0.5 to 1.5 microns is used as hard mask layer 113. The silicon oxide layer covers the entire wafer surfaces including the edges. The oxide on the wafer edge is not shown.

Next, at step 114, photolithographic defined or screen-printed photoresist pattern is applied on the front and back wafer surface. The photolithography process includes photoresist coating, baking, exposure, developing and post baking. The photoresist pattern consists of staggered large square openings and small square openings. It is important the square-opening patterns are precisely aligned to the wafer <100> direction on the front surface.

The patterned resist pattern is then transferred at step 116 to the hard masking layer, i.e. the front oxide layer. The pattern transferring from the photoresist layer to the oxide layer is achieved by controlled oxide etching in a buffered HF solution. During the HF wet etching, the front and back oxide opening are etched in the same time and the edge oxide layer is fully protected and kept at its original thickness. The oxide pattern on the wafer surfaces also consists of staggered large and small square openings that are aligned to the <100> crystallographic directions.

After the pattern transfer, at step 118, the remaining photoresist layer is removed by wet or dry photoresist removal methods. Next, at step 120, silicon anisotropic etching is conducted by a time-controlled KOH, NaOH, or TMAH etching that results in large pyramidal silicon cavities. The etching temperature may be in the range of approximately 50° C. to 80° C. The exposed silicon surfaces on the front and back sides are etched in the same time and the wafer edge surfaces are fully protected by the un-patterned oxide layer. The KOH etch may be time-controlled so that a certain pyramidal cavity depth may be reached. Alternatively, the KOH etching may be self-terminated when the four pyramid (111) sidewalls meet at the cavity bottom.

After the KOH etching, the remaining oxide layer is thinner than before the etching since the oxide is also etched to some extent in the KOH or TMAH solution, albeit with a much slower etch rate than silicon etch. The remaining oxide layer is then removed at step 122 in a diluted HF solution followed by standard wafer cleaning in SC2 and SC2, DI water rinsing and $N_2$ drying. At step 124, reusable pyramidal double-sided template is finished.

The 3-D TFSS manufacturing process of using the double-sided pyramidal template is same as the planar TFSS making process, except the reinforcement plates may not be needed prior to the TFSS releasing. For simplicity, the 3-D TFSS making process is not shown in figures.

Figure 8:
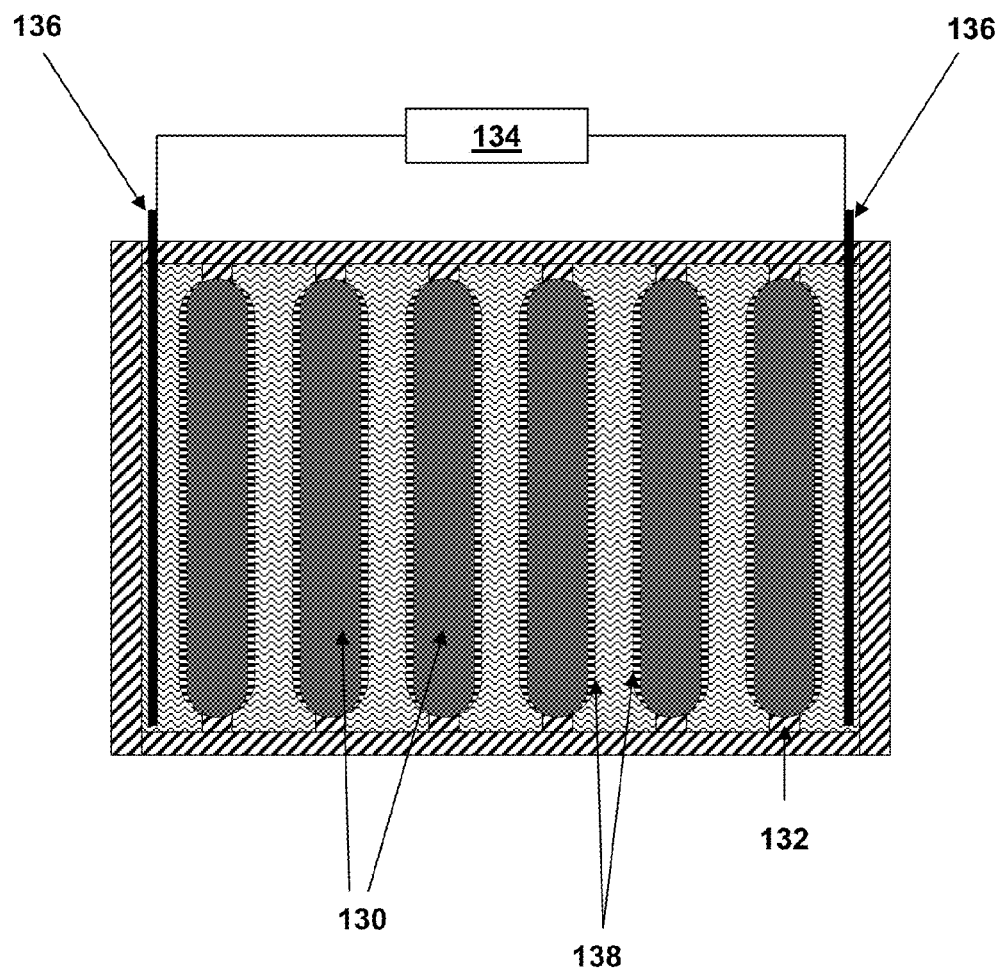
FIG. 8 illustrates a conceptual cross-sectional drawing of an apparatus for forming porous silicon layers on both sides of a silicon template in a batch process.

FIG. 8 illustrates a conceptual cross-sectional drawing of one possible embodiment of an apparatus for forming porous silicon layers on both sides of the silicon template in a batch electrochemical anodic etch process. Templates 130 are batch loaded in the etching chamber and they are individually held from and sealed at their edges with seals 132. Therefore there are no porous silicon layers formed at the very edge surface of the template. The loaded templates are spaced uniformly in the etching chamber and the electrolytic liquid (HF, IPA, and DI water mixture) between the templates has a consistent concentration and volume. The temperature of the liquid is actively controlled and gas bubbles generated during the process are timely removed by external liquid circulation and gas bubble extraction. Power supply 134 supplies power with current intensity control, time control, and polarity switching capability to electrodes 136. The electrical current polarity is periodically switched so that each template side is consecutively and cumulatively etched. In addition to the periodical current polarity switching, the current intensity is also changed in a controlled manner to form a porous silicon layer that may consists of two or thin layers with different porosities, or a graded porosity. One of ordinary skill will understand that different electrolyte volumes and concentrations, etch chamber sizes, distances between adjacent templates, current levels and polarities may be used in the embodiment of FIG. 8. The passage of electrical current creates porous silicon layers 138.

Figure 9:
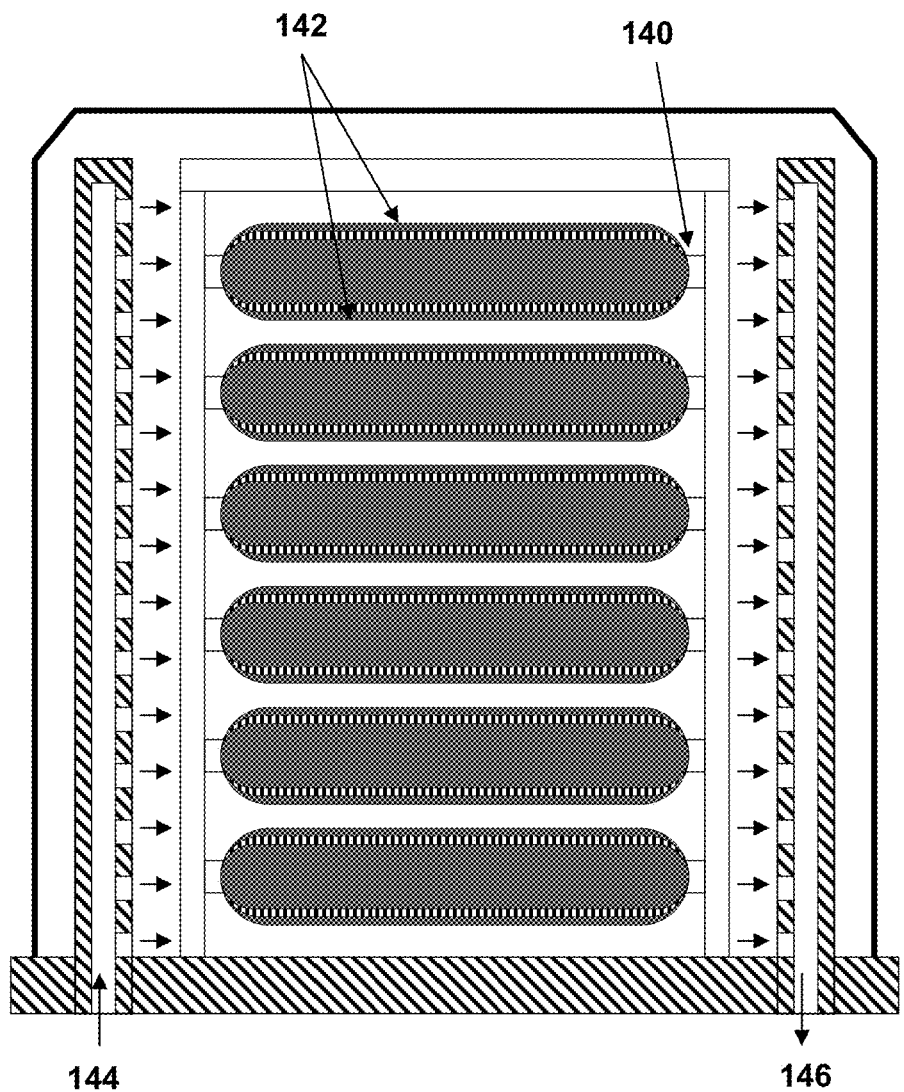
FIG. 9 illustrates a conceptual cross-sectional drawing of an apparatus for growing epitaxial silicon layers on both sides of a silicon template in a batch process.

FIG. 9 illustrates a conceptual cross-sectional drawing of an apparatus for concurrently growing epitaxial silicon layers on both sides of the silicon template in a batch process. As described above, porous silicon layers are formed on both sides of the silicon templates, except the very edges of the templates. The templates are batch loaded in the epitaxial reaction chamber and they are individually held from their edges where there are no porous silicon layers.

This edge-holding method prevents broken porous silicon debris from accumulating during the template loading and unloading process. The loaded templates are spaced uniformly in the reaction chamber. With the distributed gas injection layout, reactive gases are evenly delivered from gas injector 144 to all the exposed silicon surfaces and exhausted via exhaust 146, enabling uniform epitaxial growth within a single wafer and among wafers. The reaction chamber is heated to a high temperature in the range of 950° C. to 1200° C. during the process. The heating and its control function are not shown in FIG. 9 for simplicity.

Those with ordinary skill in the art will recognize that the disclosed embodiments have relevance to a wide variety of areas in addition to those specific examples described above.

The foregoing description of the exemplary embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

It is intended that all such additional systems, methods, features, and advantages that are included within this description be within the scope of the claims.

What is claimed is:

1. An apparatus for forming porous silicon layers on at least two surfaces of a plurality of silicon templates in a batch electrochemical anodic etch process, said apparatus comprising:

a plurality of edge-sealing template mounts, said plurality of mounts operable to prevent formation of porous silicon at the edges of a plurality of templates;
an electrolyte disposed among said plurality of templates;
an electrolyte temperature controller;
an external liquid circulation and gas bubble extractor; and
a power supply operable to switch polarity, change current intensity, and control etching time to produce said porous silicon layers.

2. An apparatus for forming porous silicon layers on at least two surfaces of a plurality of silicon templates in a batch electrochemical anodic etch process, said apparatus comprising:

a plurality of edge-sealing template mounts, said plurality of mounts operable to prevent formation of porous silicon at the edges of a plurality of templates;
an electrolyte disposed among said plurality of templates; and
a power supply operable to switch polarity, change current intensity, and control etching time to produce said porous silicon layers.

3. The apparatus of claim 2, further comprising an electrolyte temperature controller.

4. The apparatus of claim 2, further comprising an external liquid circulation and gas bubble extractor.

* * * * *